US006946600B1

(12) United States Patent
Stoller et al.

(10) Patent No.: US 6,946,600 B1
(45) Date of Patent: Sep. 20, 2005

(54) CABINET WITH CROSS-CONNECT THAT PROVIDES ACCESS TO REAR SIDE OF ELECTRONIC EQUIPMENT

(75) Inventors: Harry Stoller, Plano, TX (US); Anil Trehan, Plano, TX (US)

(73) Assignee: CommScope Solutions Properties, LLC., Sparks, NV (US)

( * ) Notice: Subject to any disclaimer, the term of this patent is extended or adjusted under 35 U.S.C. 154(b) by 0 days.

(21) Appl. No.: 10/788,399

(22) Filed: Mar. 1, 2004

(51) Int. Cl.[7] .............................................. H02G 3/08
(52) U.S. Cl. ........................ 174/50; 174/58; 174/17 R; 174/60; 361/695; 248/906; 439/535
(58) Field of Search .................. 174/50, 58, 17 R, 174/60; 361/695, 796; 312/265.6; 439/535; 248/906

(56) References Cited

U.S. PATENT DOCUMENTS

| | | | |
|---|---|---|---|
| 3,912,348 A * | 10/1975 | Seymour ..................... | 312/100 |
| 4,901,202 A | 2/1990 | Leschinger | |
| 5,136,463 A | 8/1992 | Webster | |
| 5,208,737 A | 5/1993 | Miller | |
| 5,239,128 A | 8/1993 | Golden et al. | |
| 5,574,251 A * | 11/1996 | Sevier ......................... | 174/50 |
| 5,781,410 A | 7/1998 | Keown et al. | |
| 6,316,728 B1 | 11/2001 | Hoover et al. | |
| 6,365,826 B1 * | 4/2002 | Stendardo et al. ........ | 174/17 VA |
| 6,606,253 B2 * | 8/2003 | Jackson et al. ............. | 361/796 |
| 6,649,830 B1 * | 11/2003 | Bartlett et al. ............. | 174/50 |
| 6,788,535 B2 * | 9/2004 | Dodgen et al. ............. | 361/695 |
| 6,791,027 B1 * | 9/2004 | Nicolai et al. .............. | 174/50 |
| 6,818,823 B2 * | 11/2004 | Barnes ......................... | 174/50 |

OTHER PUBLICATIONS

Newton Instrument Company, INc., Catalog 15A, Section K, Outdoor Communication Enclosures, 7000-Series, (May 24, 1999).
ADC Telecommunications Inc., Brochure, Boradband Housing Solutions, (Feb. 2003).
Avaya Inc., Avaya Manual 631-600-294, 52C and 52C Outdoor Electronics Cabinets, Chapter 1, Issue 1, (Feb. 2001).

* cited by examiner

*Primary Examiner*—Dhiru R. Patel
(74) *Attorney, Agent, or Firm*—Birch, Stewart, Kolasch & Birch, LLP

(57) ABSTRACT

A cabinet includes a first compartment for housing electronic equipment, such as equipment used to provide telephone service and/or voice and data networking services. The front of the equipment housed in the first compartment is accessible via at least one door. The cabinet also includes a second compartment accessible by a second door, on an opposite side of the cabinet. The second compartment is for housing a connection panel, which allows subscriber lines to be connected to provider lines and/or terminals of the electronic equipment. A partitioning wall separates the first and second compartments and includes an access port communicating the first and second compartments. When the connection panel is moved, e.g. pivoted by use of a hinge, a service technician can gain access to the rear of the electronic equipment housed in the first compartment via the access port. An access panel can be used to close the access port so that the temperature and/or humidity of the first compartment can be regulated, as compared to the conditions in the second compartment and outside of the cabinet.

29 Claims, 5 Drawing Sheets

CABINET WITH CROSS-CONNECT THAT PROVIDES ACCESS TO REAR SIDE OF ELECTRONIC EQUIPMENT

BACKGROUND OF THE INVENTION

1. Field of the Invention

The present invention relates to cabinets for housing electronic equipment. More particularly, the present invention relates to a cabinet for housing electronic equipment and a connection panel for cross-connecting the electronic equipment with various provider and/or subscriber lines, wherein the cabinet provides access to the connection panel, and access to the front and rear sides of the electronic equipment.

2. Description of the Related Art

Outdoor cabinets that house electronic equipment and connection panels are generally known in the art. The connection panel (sometimes referred to as a feeder-distribution interface), within the cabinet, is used to connect subscriber lines to provider lines directly, or in parallel or serial, with terminals of certain electronic equipment also within the cabinet, such as surge protectors, switches, servers, etc. Often, the electronic equipment is sensitive to temperature and humidity, so the cabinet's interior is environmentally controlled by employing a heat exchanger, dehumidifier, and/or air conditioner.

In some cabinets in use today, the electronic equipment needs to be accessible only on its front side. In other words, a service technician only needs to access a front side of the various components of the electronic equipment in order to make routine maintenance checks and to modify certain parameters. No access to the rear side of the electronic equipment is typically needed.

FIG. 1 shows a cabinet 11, in accordance with the background art, having a first door 13, which provides access to the front side of electronic equipment 15 housed within a first compartment 12. The cabinet 11 also includes a second door 17, which provides access to a connection panel 19 housed within a second compartment 14. The first compartment 12 is separated from the second compartment 14 by a partitioning wall 16. Therefore, the first compartment 12 can be climate controlled.

As can be seen in FIG. 1, no access can be gained to the backsides of the electronic equipment 15. It would be necessary to remove the electronic equipment 15 to access the backsides of the electronic equipment 15. Removing the electronic equipment 15 is time consuming and can necessitate disconnections of cables between the electronic equipment 15 and the connection panel 19. Moreover, the design of FIG. 1 includes a "dead space" 21, which is unusable. Hence, the cabinet 11 is not compact.

Some of today's newer equipment requires occasional access to the rear panels of the electronic equipment—typically to access cable connectors or to adjust switches located on the backsides of the electronic equipment. Moreover, today's electronic equipment can accommodate more users and connections, hence larger connection panels are associated with the electronic equipment. To address the need for rear access to the electronic equipment, one solution, in accordance with the background art, is to modify the cabinet design.

FIG. 2 illustrates a modified cabinet design 31. The cabinet design of FIG. 2 is similar to the cabinet design of FIG. 1, however the electronic equipment 33 is located on a swing out rack 35. If the technician opens the first door 32, access can be gained to the front sides of the electronic equipment 33. If the technician, swings the electronic equipment 33 out of the cabinet 31, using the swing out rack 35, access can be gained to the backsides of the electronic equipment 33.

It can be seen that the cabinet 31 of FIG. 2 still includes the dead space 21. Further, in order to permit the electronic equipment 33 to clear the partitioning wall 16, the cabinet 31 requires additional dead space 18. Hence, the cabinet 31 must be made wider than the cabinet 11 of FIG. 1, and the compact nature of the cabinet 31 is made worse. It should also be noted that the swing out rack 35 must be robust in construction and must be accommodated within the cabinet 31. Thus again, there is an increase in the size and weight of the cabinet 31. Further, there is an increase in the overall cost of the cabinet 31, associated with the cost of the additional swing out rack 35.

FIG. 3 illustrates another cabinet 41 in accordance with the background art. The cabinet 41 includes a third door 43. The third door 43 allows access to the backside of the electronic equipment 45 within the cabinet 41.

As can be seen in FIG. 3, the cabinet 41 still includes the dead space 21. Further, the sweep of the third door 43 on a third side of the cabinet 41 limits the area at which the cabinet 41 can be installed. Now, the cabinet 41 must be sufficiently spaced from adjacent cabinets, buildings, trees, etc. on three sides, as opposed to two sides, with regard to the cabinets 11 and 31 of FIGS. 1 and 2.

FIG. 4 illustrates another cabinet 51 in accordance with the background art. Like the cabinet 41 of FIG. 3, the cabinet 51 includes first, second and third doors 53, 55, 57. The first door 53 allows access to the front sides and rear sides of the electronic equipment 59. The rear sides are accessible when the electronic equipment 59 is swung out on a swing out rack 61, as described in relation to FIG. 2.

The dead space 21 within the cabinets of FIGS. 1–3 has been replaced with additional electronic equipment 63 or a connection panel. The additional electronic equipment 63 or connection panel can reside on the base of the cabinet 51. Alternatively, the additional equipment 63 or connection panel can also be supported on another swing out rack 61. The second door 55 provides access to splices, a load center, or environmental control equipment 67.

As can be seen in FIG. 4, the sweep of a third door 57 on a third side of the cabinet 51, again, limits the area at which the cabinet 51 can be installed. Although the cabinet 51 allows access to the rear sides of the electronic equipment 59 and 63, there is again the cost and space associated with the one or two swing out racks 61. Moreover, the swing out racks 61 require that a clearance space 65 be provided within the cabinet 51, so that the electronic equipment 59 and/or 63 can pivot out to the cabinet 51. Thus, the compact nature of the cabinet 51 is adversely affected.

FIG. 5 illustrates another cabinet 71 in accordance with the background art. The cabinet 71 includes first, second, third and fourth doors 73, 75, 77, 79. The first and second doors 73, 75 allow access to the front side and rear sides of the electronic equipment 81 and 83. The rear sides of the electronic equipment 81 and 83 are accessible when the electronic equipment 81 and 83 are swung out on swing out racks 85 and 87. The third and fourth doors 77 and 79 provide access to a connection panel 88.

Although the cabinet 71 allows access to the rear sides of the electronic equipment 81 and 83, there is again the cost and space associated with the two swing out racks 85 and 87. Moreover, the swing out racks 85 and 87 require that clearance spaces 84 and 86 be provided within the cabinet 71, so that the electronic equipment 81 and 83 can pivot out of the cabinet 71. Thus, the compact nature of the cabinet 71 is adversely affected.

FIG. 6 illustrates another arrangement, in accordance with the background art, which includes first and second cabinets 91 and 92. The first cabinet 91 includes first, second, third and fourth doors 93, 95, 97, 99. The first and second doors 93, 95 allow access to the front side of the electronic equipment 101 and 103. The rear sides of the electronic equipment 101 and 103 are accessible via the third and fourth doors 97 and 99. The second cabinet 92 includes fifth and sixth doors 105 and 107. The fifth and sixth doors 105 and 107 provide access to a connection panel 109.

As can be seen in FIG. 6, the arrangement requires the expense of two separate cabinets 91 and 92. Moreover, the connections between the electronic equipment 101 and 103 (within the first cabinet 91) and the connection panel 109 (within the second cabinet 92) must pass outside of both of the first and second cabinets 91 and 92. This is more expensive and troublesome. Further, the arrangement increases the risks of contamination entering the cabinets 91 and 92, and increases the risk of reduced climate control within the cabinets 91 and/or 92. Further, the sweep of the first through sixth doors 93, 95, 97, 99, 105, 107 restricts the potential location positions for the first and second cabinets 91 and 92.

SUMMARY OF THE INVENTION

It is an object of the present invention to address one or more of the drawbacks associated with the cabinet designs of the background art.

It is an object of the present invention to provide a cabinet design which allows access to a connection panel and the front and rear sides of electronic equipment housed within the cabinet, while maintaining a compact size for the cabinet.

It is an object of the present invention to provide a cabinet design which allows access to a connection panel and the front and rear sides of electronic equipment housed within the cabinet, while reducing the overall cost of the cabinet.

It is an object of the present invention to provide a cabinet design which allows access to a connection panel and the front and rear sides of electronic equipment housed within the cabinet, while providing greater flexibility in the cabinet's potential positioning, e.g. reducing the footprint required by the door sweeps to access the cabinet's contents.

These and other objects are accomplished by a cabinet including a first compartment for housing electronic equipment, such as equipment used to provide telephone service and/or voice and data networking services. The front of the equipment housed in the first compartment is accessible via at least one door. The cabinet also includes a second compartment accessible by a second door, on an opposite side of the cabinet. The second compartment is for housing a connection panel, which allows subscriber lines to be connected to provider lines and/or terminals of the electronic equipment. A partitioning wall separates the first and second compartments and includes an access port communicating the first and second compartments. When the connection panel is moved, e.g. pivoted by use of a hinge, a service technician can gain access to the rear of the electronic equipment housed in the first compartment via the access port. An access panel can be used to close the access port so that the temperature and/or humidity of the first compartment can be regulated, as compared to the conditions in the second compartment and outside of the cabinet.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Figure 1:
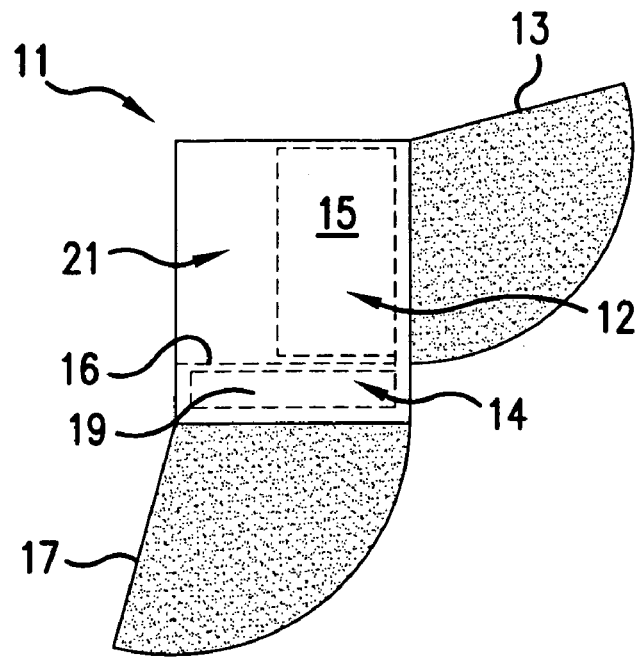
FIG. 1 is a plan view of a first cabinet, in accordance with the background art.
Figure 2:
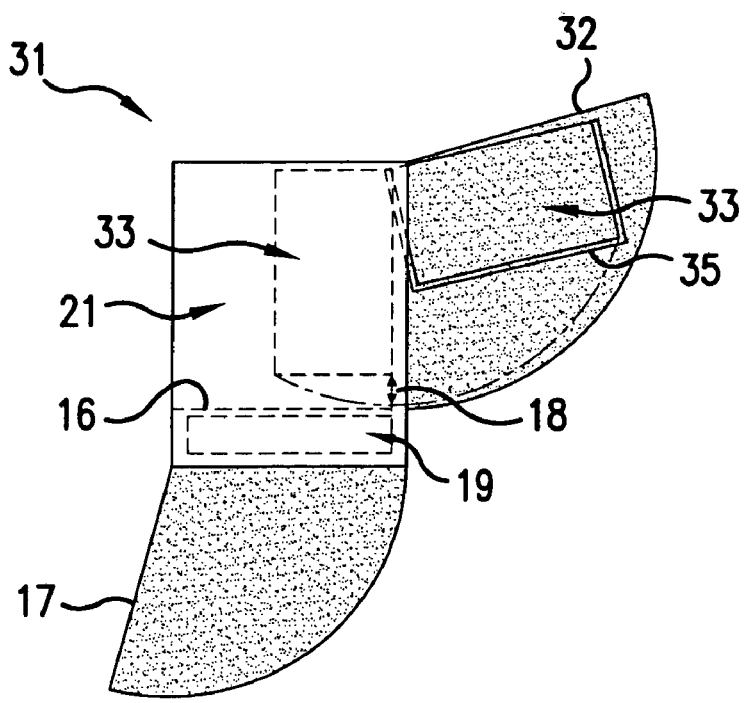
FIG. 2 is a plan view of a second cabinet, in accordance with the background art.
Figure 3:
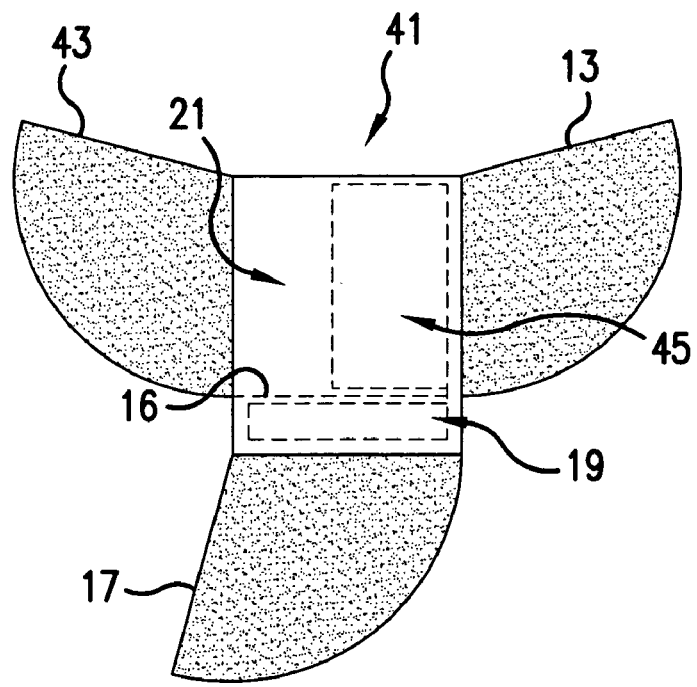
FIG. 3 is a plan view of a third cabinet, in accordance with the background art.
Figure 4:
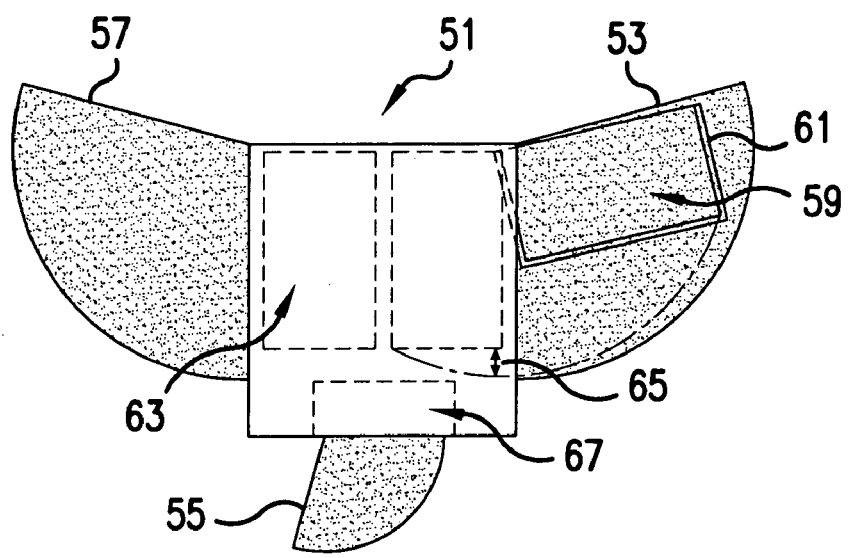
FIG. 4 is a plan view of a fourth cabinet, in accordance with the background art.
Figure 5:
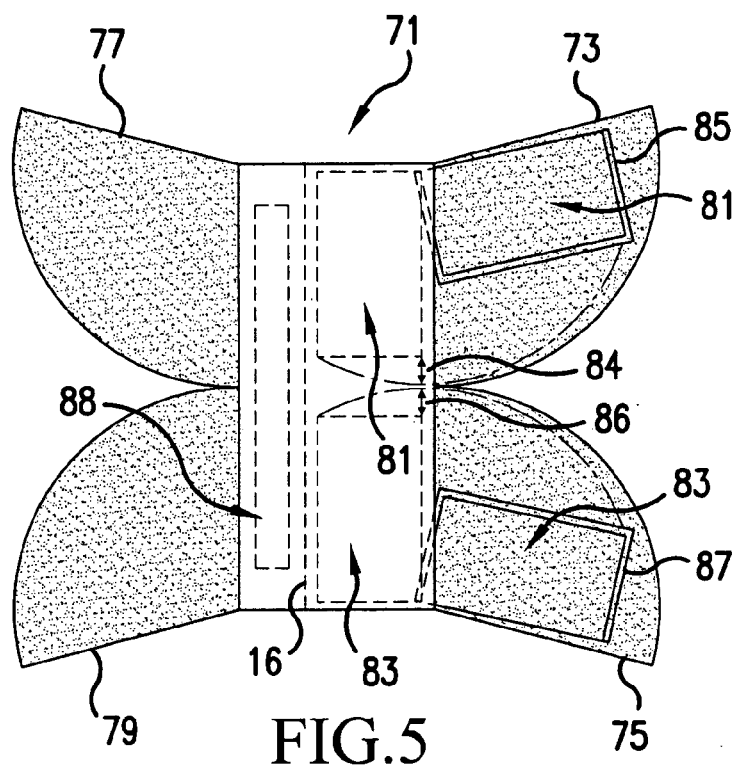
FIG. 5 is a plan view of a fifth cabinet, in accordance with the background art.
Figure 6:
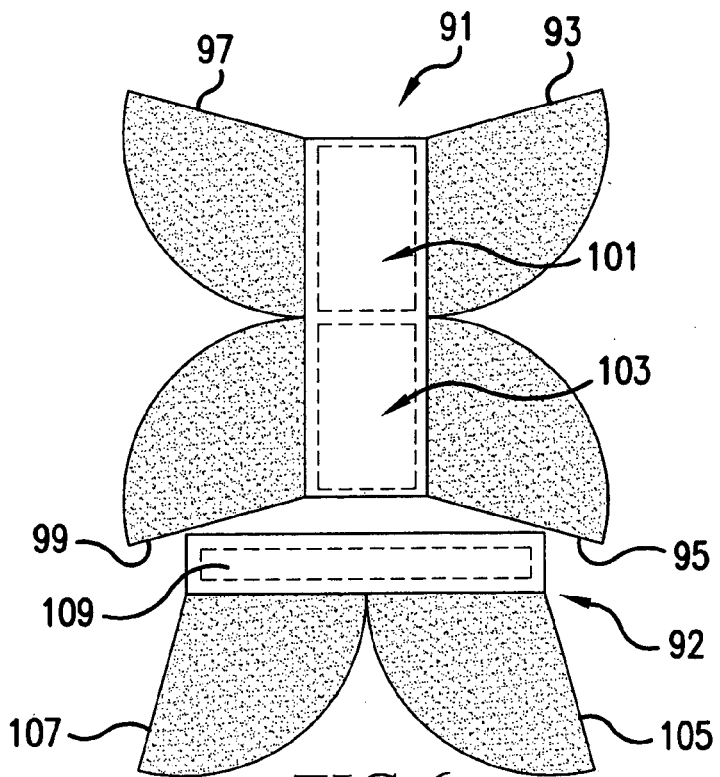
FIG. 6 is a plan view of a sixth cabinet, in accordance with the background art.
Figure 7:
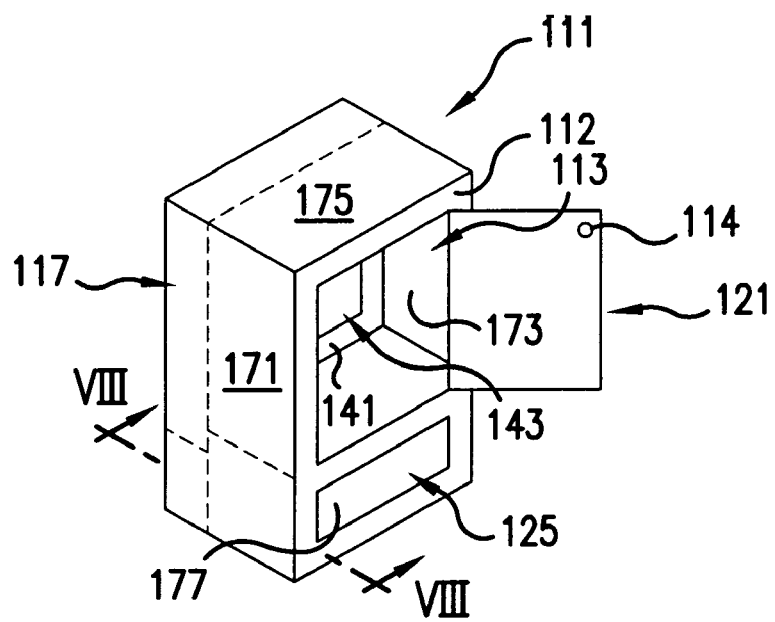
FIG. 7 is a front perspective view of a cabinet, in accordance with the present invention.
Figure 8:
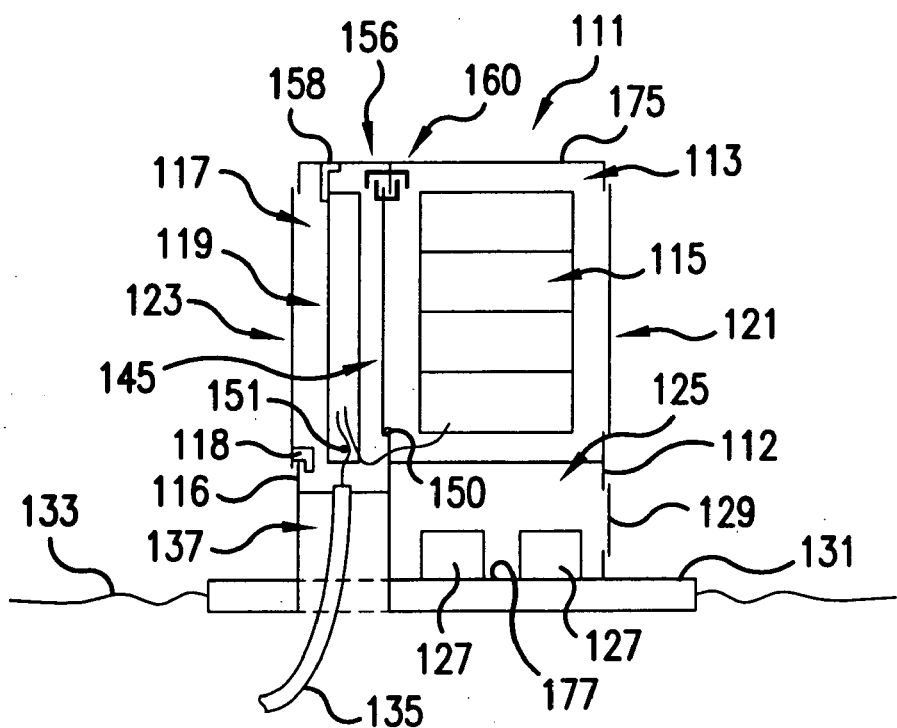
FIG. 8 is a cross-sectional view taken along line VIII—VIII in FIG. 7, illustrating electronic equipment within the housing and a connection panel in a first position within the housing.

FIGS. 7 and 8 illustrate an outdoor cabinet 111, in accordance with the present invention. The cabinet 111 includes a first compartment 113 for housing electronic equipment 115. The cabinet 111 also includes a second compartment 117 for housing a connection panel 119.

A first door 121 provides access to the first compartment 113. Once the first door 121 is opened, a service technician can access the front side of the electronic equipment 115 to perform maintenance operations or to set control parameters.

The cabinet 111 includes a first side 112; a second side 116, opposite said first side; a third side 171 bordering said first and second sides 112 and 116; a fourth side 173, opposite said third side 171, and bordering said first and second sides 112 and 116; a top side 175 bordering said first, second, third and fourth sides 112, 116, 171 and 173; and a bottom side 177, opposite said top side 175, and bordering said first, second, third and fourth sides 112, 116, 171 and 173. The first door 121 can be attached to a first the first side 112 of the cabinet 111 by a horizontal hinge. Alternatively, the first door 121 could be attached to the first side 112 of the cabinet 111 by a vertical hinge, or the first door 121 could be a removable door, e.g. a panel secured to the cabinet 111 by screws.

Typically, a first lock 114 is attached to the first door 121. The first lock 114 restricts access to the cabinet 111, so that only an authorized service technician can access the first compartment 113.

A second door 123 provides access to the second compartment 117. Once the second door 123 is opened, a service technician can access the front side of the connection panel 119 to cross connect cables via the connection panel 119, or to splice wires directly.

The second door 123 can be attached to the second side 116 of the cabinet 111 by a horizontal hinge. Alternatively, the second door 123 could be attached to the second 116 of the cabinet 111 by a vertical hinge, or the second door could be a removable door, e.g. a panel secured to the cabinet by screws.

Typically, a second lock 118 is attached to the second door 123, so that only an authorized service technician can access the second compartment 117. A key or code for the second lock 118 may be different than a key or code for the first lock 114. By this arrangement, limited access to the first and second compartments 113 and 117 of the cabinet 111 can be accomplished. For example, less-trained service technicians may be given access to only the second compartment 117.

As seen in FIGS. 7 and 8, a third compartment 125 is provided below the first and second compartments 113 and 117. The third compartment 125 may house power backup equipment, such as batteries 127. A third door 129 controls access to the third compartment 125.

The third door 129 can be attached to the first side 112 of the cabinet 111 by a horizontal hinge. Alternatively, the third door 129 could be attached to the first side 112 of the cabinet 111 by a vertical hinge, or the third door 129 could be a removable door, e.g. a panel secured to the cabinet 111 by screws. In another preferred embodiment, the third door 129 is a drawer front, and the batteries 127 are supported on a drawer base and may be withdrawn from the third compartment 125 of the cabinet 111. Of course, the third door 129 may optionally include a lock.

As illustrated in FIG. 8, the cabinet 111 may rest upon a slab 131 placed upon the ground 133. Underground Cables 135 enter into an entrance area 137 from beneath the cabinet 111. Preferably, the entrance area 137 is located adjacent and beneath a lower edge of the connection panel 119.

As illustrated in FIG. 8, a partitioning wall 141 separates the first compartment 113 from the second compartment 117. The partitioning wall 141 includes at least one access port 143. The access port 143 communicates the space within the first compartment 113 with the space within the second compartment 117.

An access door 145 is employed to block the access port 143. The access door 145 can be attached to the partitioning wall 141 by a vertical or horizontal hinge. Alternatively, the access door 145 could be a removable door, e.g. a panel secured to the partitioning wall 141 by screws. In a preferred embodiment, the access door 145 is pivotably connected to the partitioning wall 141 by a horizontal hinge 150.

Figure 9:
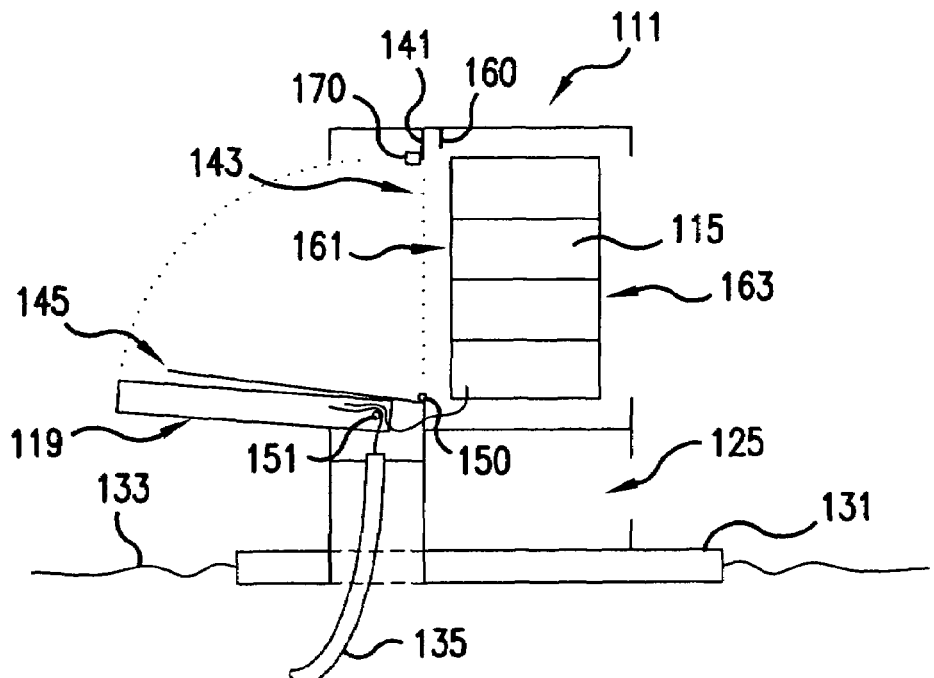
FIG. 9 is a cross sectional view similar to FIG. 8, but illustrating the connection panel in a second position allowing access to a rear side of the electronic equipment.

As illustrated in FIG. 9, hardware, such as a horizontal hinge 151, pivotably connects the connection panel 119 to the cabinet 111. Hence, when the second door 123 is opened, a service technician can release a latch 158, and pivot a top edge of the connection panel 119 away from the first compartment 113.

Once the connection panel 119 is pivoted away from the first compartment 113, the service technician can manipulate the access door 145. For example, the service technician can release a latch 156, and pivot a top edge of the access door 145 away from the first compartment 113.

Once the access door 145 has been moved away from the access port 143, as illustrated in FIG. 9, the service technician has access to the back sides 161 of the electronic equipment 115. Hence, the backsides of the equipment 115 are accessible via the second compartment 117, when the access door 145 is opened, and the front sides 163 of the electronic equipment 115 are accessible when the first door 121 is opened.

In a preferred embodiment, the first door 121 and the access door 145 are capable of sealing with the first side 112 of the cabinet 111 and the partitioning wall 141, respectively. By this arrangement, the first compartment 113 can be climate controlled, independent of the second and third compartments 117 and 125. This is advantageous in that the electronic equipment 115 is often susceptible to temperature and humidity, whereas the connection panel 119 and the batteries 127 are not. Therefore, the first compartment 113 can be separately climate controlled, and the expense of climate controlling the second and third compartments 117 and 125 can be avoided. Further, accessing the second compartment 117 does not create a climate shock to the electronic equipment 115 located in the first compartment 113.

It would also be possible to have the latch 156 being operable by a key or code which is different from the key or code that opens the second lock 118. By this arrangement, a service technician with access to the connection panel 119, would not by necessity also have access to the rear sides of the electronic equipment 115.

Instead of having a latch 156 with a different coding or keying, it would also be possible to lock the access door 145 using a latch 160 which is only accessible from within the first compartment 113. Therefore, a service technician having access to the first compartment via the first door 121 could disengage the latch 160 so that the rear sides of the electronic equipment 115 could be accessed via the access port 143.

FIG. 9 also illustrates a sensor 170 attached to the partitioning wall 141 and located adjacent to the access door 145. The sensor 170 may be of any known design, such as a reed switch, which senses the presence of a metal strip attached to the edge of the access door 145. The sensor 170 can be used to activate an alarm when the access door 145 is opened or to create a log of the event in a memory. Such sensors 170 may optional be included in combination with the first and second doors 121 and 123, as well as, the connection panel 119, to sense movement of these elements.

Figure 10:
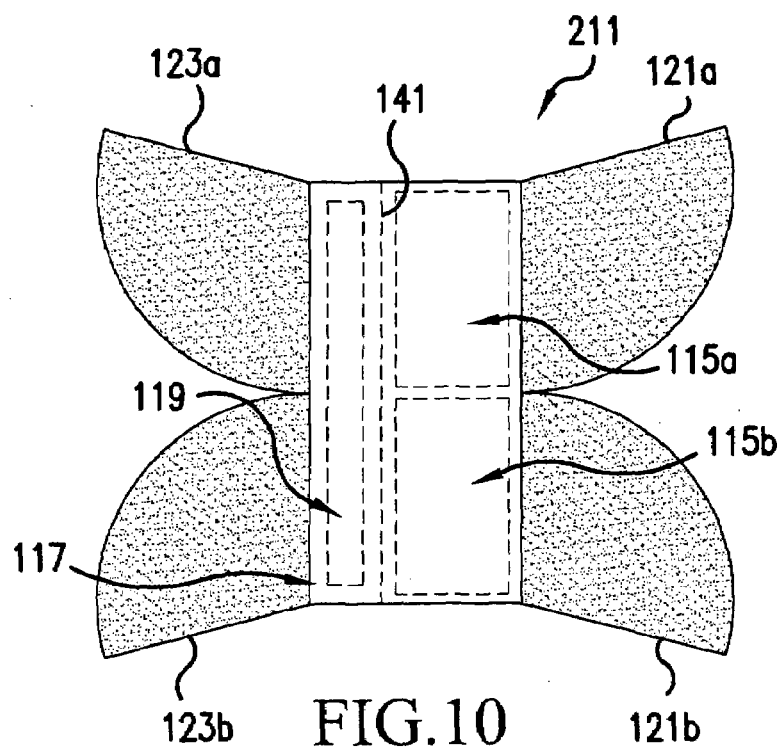
FIG. 10 is a plan view illustrating an alternative embodiment of the cabinet in FIG. 7, wherein double swinging doors are provided on each side of the cabinet.

FIG. 10 illustrates a modified cabinet 211, in accordance with the present invention. The modified cabinet 211 has the first door 121 replaced by two first doors 121*a* and 121*b*. Further, the second door 123 is replaced by two second doors 123*a* and 123*b*. Further, the electronic equipment 115 can include a first stack of electronic equipment 115*a* and a second stack of electronic equipment 115*b*. In all other regards, the modified cabinet 211 can be constructed in a same or similar manner, as discussed in relation to FIGS. 7–9.

Although the drawings illustrate a single connection panel 119, it should be appreciated that two or more separate connection panels 119 could be included within the second compartment 117. Under such circumstances, at least one of the connection panels 119 would be moveably mounted in the second compartment 117, to provide access to one or more access ports 143 located behind it. Further, it would also be possible that several or all of the connection panels 119 could be moveable to reveal several access ports 143 located behind them.

Although horizontal hinges 150 and 151 have been illustrated to permit movement of the access door 145 and connection panel 119, it should be appreciated such hinges may be vertical hinges or even replaced with other hardware, such as a four bar linkage with or without spring/cylinder movement assistance to enable movement of the access door 145 and the connection panel 119.

In the drawings, the sides of the cabinets 111 and 211 have been illustrated as being planar. However, it should be appreciated that the sides could also be stepped planar surfaces, or curved surfaces, or combinations thereof.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

We claim:

1. A cabinet comprising:
   a first side;
   a second side opposite said first side;
   a third side bordering said first and second sides;
   a fourth side, opposite said third side, and bordering said first and second sides;
   a top side bordering said first, second, third and fourth sides;
   a bottom side, opposite said top side, and bordering said first, second, third and fourth sides;
   a first door attached to said first side for providing access to a first compartment within said cabinet for housing electrical equipment;
   a second door attached to said second side for providing access to a second compartment within said cabinet for housing a connection panel; and
   hardware attached to said cabinet for supporting the connection panel so that the connection panel can be moved between a first position and a second position, wherein when the connection panel is in the first position access to said first compartment within said cabinet is not possible via said second compartment, and when the connection panel is in the second position, access can be gained to said first compartment via said second compartment.

2. The cabinet according to claim 1, wherein said hardware includes at least one hinge.

3. The cabinet according to claim 1, further comprising:
   a third compartment within said cabinet for housing batteries; and
   a third door provided in at least one of said first, second, third and fourth sides to provide access to said third compartment.

4. The cabinet according to claim 3, wherein said third compartment is located beneath said first and second compartments.

5. The cabinet according to claim 1, wherein said first door is a single panel horizontally hinged to said first side.

6. The cabinet according to claim 1, wherein said first door includes a first panel and a second panel, each begin hinged to said first side.

7. The cabinet according to claim 1, further comprising:
   a partitioning wall provided within said cabinet to separate said first compartment from said second compartment, wherein said partitioning wall includes an access port joining said first compartment to said second compartment.

8. The cabinet according to claim 7, further comprising:
   an access door for closing said access port.

9. The cabinet according to claim 8, further comprising:
   a sensor to sense whether or not said access door opens or closes said access port.

10. The cabinet according to claim 8, wherein said access door and said first door close said first compartment to create a substantially weather-tight first compartment.

11. The cabinet according to claim 10, further comprising:
    a latch associated with said access door to prevent unauthorized persons from obtaining access to said first compartment via said second compartment.

12. The cabinet according to claim 8, further comprising:
    a latch associated with said access door to prevent unauthorized persons from obtaining access to said first compartment via said second compartment.

13. The cabinet according to claim 12, wherein said latch can only be disengaged from within said first compartment.

14. The cabinet according to claim 12, wherein said latch can only be disengaged from within said second compartment.

15. The cabinet according to claim 12, wherein said latch can only be disengaged after being interacted with from within both said first and second compartments.

16. An electronic equipment cabinet comprising:
    a first side;
    a second side opposite said first side;
    a third side bordering said first and second sides;
    a fourth side, opposite said third side, and bordering said first and second sides;
    a top side bordering said first, second, third and fourth sides;
    a bottom side, opposite said top side, and bordering said first, second, third and fourth sides;
    a first door attached to said first side for providing access to a first compartment within said cabinet for housing electrical equipment;
    a second door attached to said second side for providing access to a second compartment within said cabinet;
    a connection panel housed within said second compartment; and
    hardware attached to said cabinet and attached to said connection panel for supporting said connection panel so that said connection panel can be moved between a first position and a second position, wherein when said connection panel is in the first position access to said first compartment within said cabinet is not possible via said second compartment, and when said connection panel is in the second position, access can be gained to said first compartment via said second compartment.

17. The electronic equipment cabinet according to claim 16, wherein said hardware includes at least one hinge.

18. The electronic equipment cabinet according to claim 17, wherein said at least one hinge is horizontally oriented and allows a top of said connection panel to pivot away from said first compartment.

19. The electronic equipment cabinet according to claim 16, further comprising:
    a partitioning wall provided within said cabinet to separate said first compartment from said second compartment, wherein said partitioning wall includes an access port joining said first compartment to said second compartment; and
    an access door for closing said access port.

20. The electronic equipment cabinet according to claim 19, wherein said access door and said first door close said first compartment to create a substantially weather-tight first compartment.

21. The electronic equipment cabinet according to claim 19, wherein said access door is connected to said connection panel and moves together with said connection panel when said connection panel is moved from the first position to the second position.

22. The electronic equipment cabinet according to claim 19, wherein said hardware includes at least one hinge, which is horizontally oriented and allows a top of said connection panel to pivot away from said first compartment, and wherein said access door is horizontally pivotable about an axis proximate its lower edge.

23. The electronic equipment cabinet according to claim 19, wherein said access port is a first access port and further comprising:
a second access port provided in said partitioning wall, wherein said first access port provides access to a first portion of said first compartment and said second access port provides access to a second portion of said first compartment.

24. The electronic equipment cabinet according to claim 16, further comprising:
cables entering from a lower portion of said cabinet proximate a bottom of said connection panel.

25. The electronic equipment cabinet according to claim 24, wherein said cables include splices connected to either side of said access panel and/or a side of said cross connect panel facing toward said access panel.

26. An electronic equipment cabinet comprising:
a first side;
a second side opposite said first side;
a third side bordering said first and second sides;
a fourth side, opposite said third side, and bordering said first and second sides;
a top side bordering said first, second, third and fourth sides;
a bottom side, opposite said top side, and bordering said first, second, third and fourth sides;
a first door attached to said first side for providing access to a first compartment within said cabinet;
electronic equipment housed within said first compartment;
a second door attached to said second side for providing access to a second compartment within said cabinet;
a connection panel housed within said second compartment; and
hardware attached to said cabinet and attached to said connection panel for supporting said connection panel so that said connection panel can be moved between a first position and a second position, wherein when said connection panel is in the first position access to said first compartment is not possible via said second compartment, and when said connection panel is in the second position, access can be gained to said first compartment via said second compartment.

27. The electronic equipment cabinet according to claim 26, further comprising:
equipment to control a temperature and/or humidity level within said first compartment.

28. The electronic equipment cabinet according to claim 27, further comprising:
a partitioning wall provided within said cabinet to separate said first compartment from said second compartment, wherein said partitioning wall includes an access port joining said first compartment to said second compartment; and
an access door for closing said access port.

29. The electronic equipment cabinet according to claim 28, wherein said access door and said first door close said first compartment to create a substantially weather-tight first compartment.

* * * * *